United States Patent [19]
Wu et al.

[11] Patent Number: 5,130,768
[45] Date of Patent: Jul. 14, 1992

[54] COMPACT, HIGH-DENSITY PACKAGING APPARATUS FOR HIGH PERFORMANCE SEMICONDUCTOR DEVICES

[75] Inventors: Andrew L. Wu, Shrewsbury; Martin W. Czekalski, Northboro, both of Mass.

[73] Assignee: Digital Equipment Corporation, Maynard, Mass.

[21] Appl. No.: 624,034

[22] Filed: Dec. 7, 1990

[51] Int. Cl.$^5$ .................. H01L 25/04; H01L 39/02
[52] U.S. Cl. ........................... 357/82; 357/75; 357/80; 357/81; 357/74; 361/412; 361/420; 439/69; 439/74
[58] Field of Search .............. 357/80, 82, 75, 81, 357/74; 361/412, 414, 420; 439/69, 71, 74, 75

[56] References Cited
U.S. PATENT DOCUMENTS

| | | | |
|---|---|---|---|
| 3,459,998 | 8/1969 | Focarile | 317/100 |
| 3,764,856 | 10/1973 | Martin | 174/16.3 |
| 3,904,934 | 9/1975 | Martin | 317/101 |
| 3,999,105 | 12/1976 | Archey et al. | 317/100 |
| 4,082,394 | 4/1978 | Gedney et al. | 339/17 M |
| 4,542,438 | 9/1985 | Yamamoto | 361/403 |
| 4,617,193 | 10/1986 | Wu | 427/38 |
| 4,634,041 | 1/1987 | Prasad et al. | 228/124 |
| 4,652,977 | 3/1987 | Jones | 361/414 |
| 4,664,309 | 5/1987 | Allen et al. | 228/180.2 |
| 4,736,266 | 4/1988 | Tanibe | 439/74 |
| 4,802,062 | 1/1989 | Blum et al. | 361/401 |
| 4,872,844 | 10/1989 | Grebe et al. | 439/69 |
| 4,903,889 | 2/1990 | Svendsen | 228/180.2 |
| 4,949,224 | 8/1990 | Yamamura et al. | 439/69 |

OTHER PUBLICATIONS

"Hermezic Hybrid Module", IBM Tech. Dis. Bull., Martin et al., vol. 21, No. 10, Mar. 1979, pp. 4023–4024.
"Pluggable Stacked Module", IBM Tech. Bull., Falda, vol. 23, No. 12, May 1981, pp. 5410–5411.
Article entitled, "Multi-Chip Single Package 32 Bit Floating Point Digital Signal Processor with Built-in 64K-Byte SRAM Cash Memory", by C. D. Lin–Hendel, L. H. Cong, C. H. Gauntlett, and J. M. Segeleken, *IEEE Proceedings of* 1989, pp. 636–640, 1989.
Article entitled, "Bonded Interconnect Pin (BIP TM) Technology, A Novel Bare Chip Assembly Technique for Multichip Modules" by Baba et al. from Proceedings of the 1990 International Electronics Packaging Conference, Sep., 1990, pp. 1080–1091.

*Primary Examiner*—William Mintel
*Assistant Examiner*—David Ostrowski
*Attorney, Agent, or Firm*—Cesari and McKenna

[57] ABSTRACT

A compact high-density packaging arrangement for high-performance semiconductor devices includes a plurality of high-performance semiconductor chips connected to a multilayer daughter substrate member using a bare chip assembly technique known as bonded pin technology. Internal bonded pins are formed on bonding pads of the chips and soldered to conductive pads in solder wells located on the daughter substrate to provide a first level of interconnection for the chips. A larger, multilayer mother substrate member has a plurality of apertures formed in one surface thereof. These apertures are terminated by a top side of a metallized base layer of the substrate. An opposite surface of the mother substrate, i.e. a bottom side of the base layer, is affixed in thermal conductive relation to a metallic cold plate adapted for receiving a cooling fluid. External bonded pins are formed on bonding pads of the daughter substrate and inserted into corresponding solder wells located on the mother substrate. Concurrently, the bare chips are situated into the apertures in intimate thermal conductive relation to the cold plate via the metallized base layer. The pins are then soldered to conductive pads in the solder wells, thereby providing a second level of chip interconnection when other chip-populated daughter substrates are mounted thereon.

9 Claims, 4 Drawing Sheets

COMPACT, HIGH-DENSITY PACKAGING APPARATUS FOR HIGH PERFORMANCE SEMICONDUCTOR DEVICES

FIELD OF THE INVENTION

This invention relates generally to semiconductor packaging and, more specifically, to a method and apparatus for high-density interconnection and heat transfer from high-power dissipating semiconductor chips.

CROSS-REFERENCED APPLICATIONS

In patent application Ser. No. 07/453,518, filed Dec. 20, 1989, now abandoned and assigned to the assignee of the present invention and titled, "High Density Memory Array Packaging", a multichip module connected to a circuit board via edge clips provides a low-profile, high-density package for integrated circuit chips. The application does not describe the structure, interconnection and heat transfer arrangement of the present application.

BACKGROUND OF THE INVENTION

Advances in Very Large Scale Integration (VLSI) and Ultra Large Scale Integration (ULSI) semiconductor technology have resulted in improvements in the speed and performance of commercially available semiconductor integrated circuit (IC) devices or chips. These advances have increased requirements on packaging technologies used to interconnect such high-performance chips in assembled electronic systems. High-density interconnection of the chips, in conjunction with efficient heat extraction and repairability in a compact structure are among the features needed in modern high-performance chip packaging arrangements.

Previously, high-performance semiconductor devices have been assembled individually in single-chip packages such as pin grid arrays (PGA). The packaged devices are mounted on a printed wiring board (PWB), usually with heat sinks attached to dissipate the heat produced by the devices. However, the long wiring lengths needed to interconnect the devices increase stray capacitances and added inductances, resulting in decreased system performance, while the use of bulky heat sinks increase system size.

More recently, attempts have been made to develop new designs, materials and processes capable of providing high-density multilayer modules with controlled electrical characteristics. One such attempt involves the mounting of bare semiconductor chips on a high-density interconnection substrate using a tape automated bonding (TAB) technique. The bare chip is placed on its back side, that is, the side of the chip opposite the bonding pads, and affixed to a metallized base plate layer of the substrate. The exposed bonding pads of the chip are then bonded to conductors on the substrate by means of known inner lead bonding (ILB) and outer lead bonding (OLB) TAB techniques.

In this arrangement, the "pitch" of the TAB packaging leads is greater than the pitch of the chip's bonding pads, necessitating a larger bonding area or "footprint" on the substrate. This decreases the packing density of chips on the interconnection substrate. Also, a combined thermal and mechanical process, including vibration equipment, is needed to remove faulty chips.

Another approach to high-density multilayer modules with controlled electrical characteristics is described in an article entitled, "Multi-chip Single Package 32 bit Floating Point Digital Signal Processor With Built-in 64 K-Byte SRAM Cache Memory" by Lin-Hendel et al. in "Proceedings of 39th Electronic Components Conference", May, 1989 at pages 636–640. The article discloses a digital signal processing (DSP) IC and several optimized memory ICs integrated on a high-density, low parasitic silicon substrate to produce a single chip-like processing element module. The IC chips are "solder bumped" and "flip-chip" attached to the substrate. Heat generated by the DSP device is conducted to the substrate structure through the intervening solder bumps and a thin air gap.

One area of concern associated with the use of solder bump bonding involves the possibility of thermal mismatch and subsequent damage to the solder bumps when the semiconductor chips and the substrate are made of dissimilar materials and thus undergo differential thermal expansion and contraction. The resulting high shear strains may fracture the solder bump joints.

A problem also arises when a chip on the high-density substrate fails and must be replaced. If the entire substrate is globally heated during the repair process, degradation in the surface tension of the solder may cause it to flow between the closely-spaced solder bumps, causing short circuits and disrupting the alignment between the chips and substrate bonding pads.

Therefore, an object of the present invention is to provide an improved method and apparatus for high-density semiconductor packaging having high performance off-chip interconnections.

Additionally, an object of the present invention is to provide a compact, high-density chip packaging arrangement having a built-in heat extraction mechanism to remove heat from the mounted, high-performance chips.

In accordance with another aspect of the present invention, an object is to provide a high-density semiconductor packaging technique that facilitates fast, efficient and cost effective replacement of faulty chips without disturbing adjacent devices.

SUMMARY OF THE INVENTION

In general, a plurality of high-performance semiconductor chips are connected to a multilayer "daughter" substrate using a bare chip assembly technique known as bonded pin technology. The daughter substrate includes a plurality of internal signal and power conductor layers separated by insulator layers. One of the conductor layers has conductors that terminate in electrically conductive pads disposed in solder well apertures that extend down from a surface of the substrate. Additionally, apertures formed in the same surface expose conductor layer pads that function as substrate bonding pads for external bonded pins. Internal bonded pins, formed on the bonding pads of the chips, are inserted into the solder wells and soldered to the conductive pads in the wells to provide a first level of interconnection for the chips.

The arrangement also includes a larger, multilayer "mother" substrate. Solder wells containing electrically conductive pads of an internal conductor layer of this substrate extend inwardly from a surface of the substrate, as do large apertures in the form of chip-site cutouts. These apertures extend down to a metallized base layer of the substrate. An opposite surface of the mother substrate, i.e. the bottom side of the base layer, is affixed in thermal conductive relation to a metallized cold plate.

The external bonded pins extending from the bonding pads of the daughter substrate are inserted into corresponding solder wells of the mother substrate. This locates the bare chips in the cutouts of the mother substrate in intimate thermal conductive relation with the base layer thereof. The external bonded pins are then soldered to the conductive pads in the solder wells. A second level of chip interconnection is provided when a plurality of multilayer daughter substrates are likewise mounted on the mother substrate and electrically interconnected by internal conductors extending between solder wells in the mother substrate.

An advantage of this arrangement is its compact, high-density packaging structure. Moreover, the structure is assembled in a modular or level-by-level fashion, and can be extended to include a plurality of connection levels. The invention further provides an inherent heat-removing mechanism for the chips when a cooling fluid is applied to the cold plate. Also, since the chips are bonded to the daughter substrates in a pin-in-hole configuration, global heating of the multilayer daughter substrate to remove a faulty chip will not disrupt other, densely packaged chips. The pin-in-hole advantage similarly applies to removal of one of a plurality of daughter substrates bonded to the mother substrate.

In an embodiment of the invention, the assembled structure set forth above is likewise mounted to a plurality of surfaces of a cold plate. That is, a plurality of mother substrates are affixed in thermal conductive relation to corresponding surfaces of the cold plate. This alternate structure provides the advantage of further interconnection of high-performance semiconductor chips in a compact, high-density package, while retaining the inherent heat extraction and repair features described above.

Other objects, features and advantages of the invention will become apparent from a reading of the specification when taken in conjunction with the drawings in which like reference numerals refer to like elements in the several views.

DETAILED DESCRIPTION OF ILLUSTRATIVE EMBODIMENTS

Figure 1:
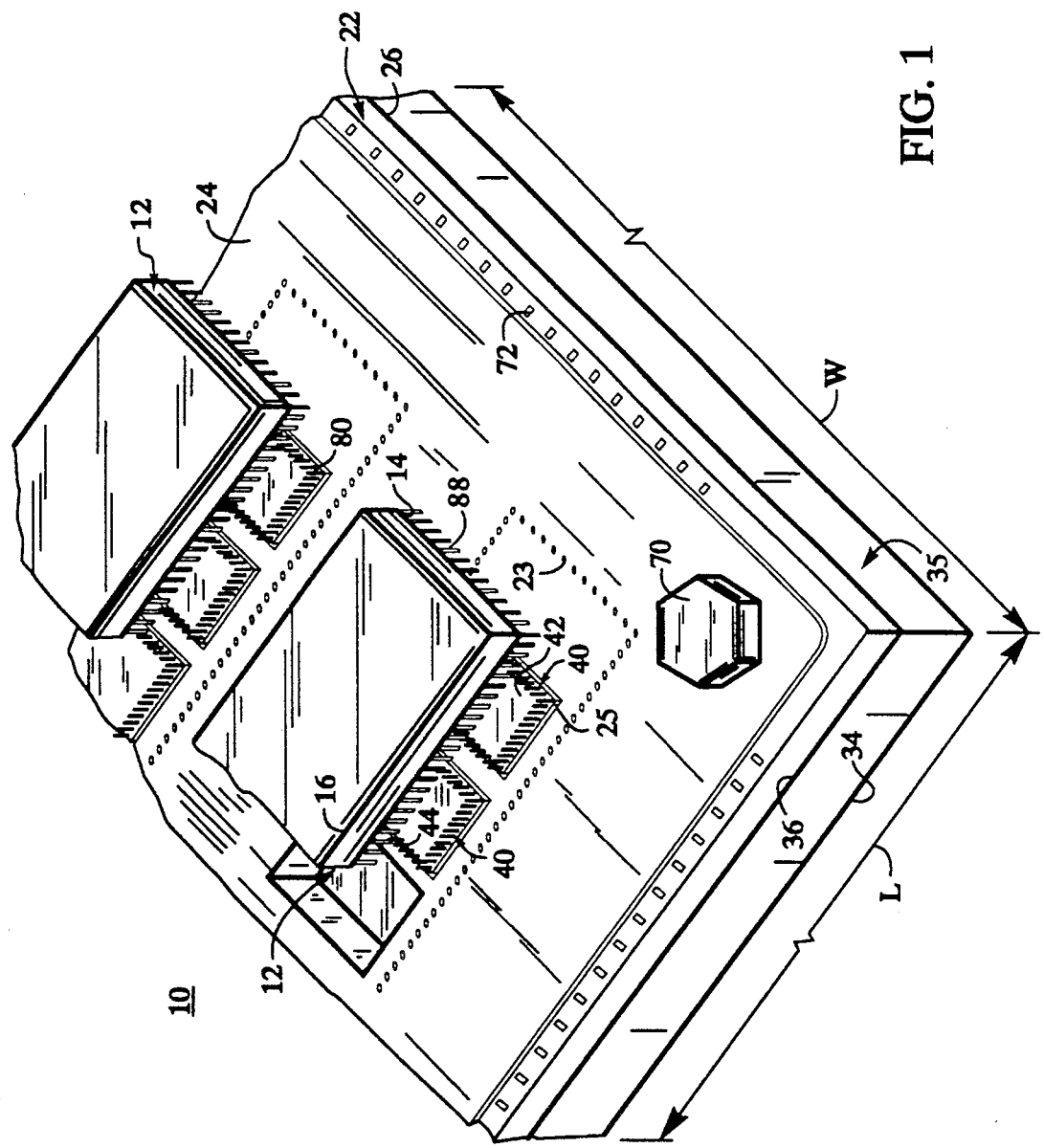
FIG. 1 is a fragmentary exploded view of a compact, high-density packaging apparatus according to the invention.

Referring now to the drawings, and particularly to FIG. 1, a high-density chip assembly, generally designated 10, includes multilayer daughter and mother substrates, generally designated 12 and 22, used to interconnect semiconductor chips in a multilevel arrangement. As will be described further herein, a plurality of chips 40 are connected to multilayer daughter substrates 12 using a high-density assembly bonding process, thereby establishing a first level of chip interconnection. Each chip-populated daughter substrate 12 is then connected to a multilayer mother substrate 22 with the chips 40 facing the mother substrate 22. A second level of chip interconnection is provided by internal conductive paths in the substrate 22 which link the daughter substrates 12. Thus, the daughter substrates 12 provide high-density local interconnections of the chips 40, while the mother substrate 22 provides global interconnections of the chips, i.e. chips on other daughter substrates 12.

For purposes of clarification, the elements in FIG. 1 (and FIGS. 2-4) are not drawn to scale. Specifically, no attempt has been made to depict the total number of chips attached to the multilayer substrates, or to scale the sizes of the chips, bonding pads and substrates.

Each daughter substrate 12 is a generally planar member having a bottom surface 14 and a top surface 16. The substrate 12 includes a plurality of conductive and non-conductive layers of material deposited upon a base layer of substrate material. In order to achieve high-density chip interconnections, daughter substrate 12 is formed in a manner different from traditional printed wiring board (PWB) construction. The daughter substrate 12 is generally produced using thin-film and lithographic techniques similar to those used in semiconductor fabrication. This results in a multilayer substrate having substantially finer conductor lines and thinner insulating layers than conventional PWB. However, modern fine-line PWB technology may be used within the teachings of the invention.

The bottom surface 14 of daughter substrate 12 has a plurality of apertures (not shown) for receiving pins extending from the chips 40 as a result of the chip bonding process described below. Surface 14 also has a plurality of bonding pads (not shown) for electrically connecting the daughter member 12 to the mother substrate 22. As can be seen in the drawing, the top surface 16 of daughter substrate 12 is generally planar and free from alteration.

The formation of the multilayer mother substrate 22 is generally identical to that of the daughter substrate 12. However, the dimensions of the mother member 22 are considerably larger than the daughter substrate 12, that is, the length L and width W of substrate 22 are greater than the respective length and width of the substrate 12. This difference in size enables the interconnection of a plurality of daughter substrates 12 by way of the mother substrate 22. It will be apparent to those skilled in the art that the relative dimensions of the substrate members may vary according to design considerations.

The mother substrate 22 has top and bottom generally planar surfaces 24 and 26. Top surface 24 has a plurality of apertures in the form of solder wells 23 constructed therein that are used for connection to the daughter substrates 12. Surface 24 also has a plurality of larger apertures in the form of chip-site cutouts 25 that extend through the substrate 22 to a base layer thereof. The cutouts 25 receive chips 40 for purposes of heat conduction in accordance with the teachings of the invention as explained herein. A more detailed description of the construction and structure of the multilayer substrates will be provided below in connection with FIG. 3.

A cold plate member, designated 35, is provided for attachment to the mother substrate 22. The cold plate 35 has a plurality of generally planar surfaces, two of which are designated 34 and 36. The dimensions of the surfaces of cold plate 35 are preferably generally identical to the dimensions of the mother substrate 22. Consequently, the surface 36 of cold plate 35 is affixed in intimate thermal conductive relation to the generally planar bottom surface 26 of substrate 22.

The cold plate 35 functions as a heat sink for conducting heat energy and, as such, is made of metal. Cold plate 35 has an internal channel structure (not shown) for receiving and coacting with a cooling fluid, for example air or liquid, when transfering heat energy away from the chips 40 and multilayer substrates 12, 22 of the assembled packaging apparatus 10. Of course, it will be apparent to those skilled in the art that other cold plate structures can be used without deviating from the inventive concepts enunciated herein.

Chip 40 is a VLSI or ULSI semiconductor chip fabricated with any number of different technologies, such as metal-oxide-semiconductor, bipolar or gallium arsenide, and is capable of generating large amounts of heat. Chip 40 is also preferably a "bare" semiconductor chip having two generally planar surfaces with bonding pads 44 formed on a surface 42 thereof. Since chip 40 is not housed within an IC package, it is capable of being connected to daughter substrate 12 by bare chip assembly techniques, such as "flip-chip" bonding. Flip-chip bonding is desirable for high-density chip packaging because the footprint required to bond the chip 40 to the substrate 12 is equal to the area of the chip itself. However, as mentioned previously, there are some limitations associated with the use of conventional flip-chip bonding techniques such as solder bump bonding.

In accordance with the present invention, chip 40 is assembled to the multilayer daughter substrate 12 utilizing a bare chip assembly technique referred to as bonded pin technology. Bonded pin technology combines the features and advantages of the primary interconnect technologies, i.e. wire bonding, TAB and flip-chip bonding, to provide electrical interconnections between chip 40 and substrate 12. In brief, internal bonded pins 80 are formed on the bonding pads 44 of a chip 40 and then placed into the solder wells (not shown) of the daughter substrate 12. The pins 80 are thereafter soldered to conductive pads located in the solder wells, thereby providing a first level of interconnection for the chips.

Unlike conventional PWB, the daughter substrate 12 is designed to accommodate tight spacing commensurate with the pitch between the bonding pads 44 of chip 40. Since the footprint required for bonded pin interconnection is equal to the area of the chip, more chips 40 can be assembled to substrate 12 than are possible using other bonding technologies such as TAB. Such high-density assembly of chips raises the issue of heat removal capabilities within the packaging apparatus, which is addressed by the inventive concepts defined herein.

External bonded pins 88 are likewise formed on the bonding pads (not shown) of the daughter substrate 12 and inserted into corresponding solder wells 23 of the mother substrate 22. At this time, the generally planar, backside surface (not shown) of the bare chip 40 is placed into a corresponding cutout 25 of the mother substrate 22 and joined in intimate thermal conductive relation to the top side of its base layer. The external bonded pins 88 are soldered to conductive pads located in the solder wells 23 to provide a second level of chip interconnection. A more detailed description of the interconnection between the chips and multilayer substrates using the bonded pin process will be provided below in connection with FIG. 4.

The above assembled packaging apparatus 10 provides a number of features and advantages. First, an inherent heat removal mechanism is provided when the chips 40 thermally interact with the cold plate 35 via the metal base layer of substrate 22, allowing for the high-density packaging of high-power dissipating chips. Second, the unique bonded pin process ensures reliable chip and multilayer member interconnection, while facilitating cost effective repair. Third, the modular assembly approach provides global interconnection of chips in a compact, high-density configuration.

Figure 2:
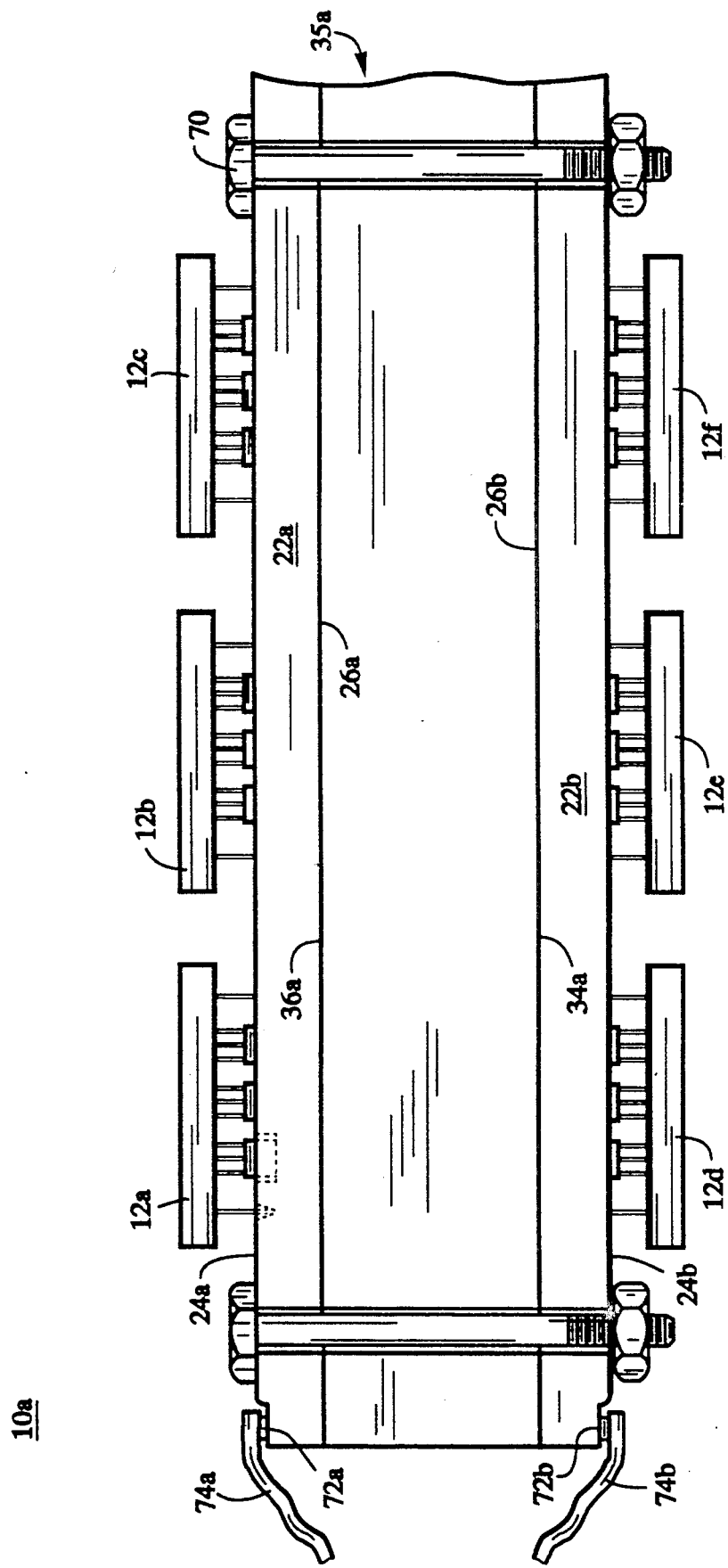
FIG. 2 is a front view of an embodiment of the compact, high-density packaging apparatus of FIG. 1.

With reference also to FIG. 2, an embodiment of the high-density packaging apparatus 10a is shown. A plurality of chip-populated daughter substrates 12a-c are mounted to a surface 24a of a mother substrate 22a using the bonded pin process. As mentioned previously, the mother substrate 22a has considerably larger dimensions than the daughter substrate 12a so as to accommodate mounting of a plurality of substrate members 12a-c. The actual dimensions of the multilayer members 12a-c and the number of daughter members mounted to a mother substrate are determined by design considerations.

A surface 26a of the mother substrate 22a and a surface 36a of cold plate 35a are affixed in intimate thermal conductive relation. That is, material having an excellent thermal quality, such as thermal grease, is applied to the surfaces 26a and 36a, and the member 22a and cold plate 35a are then securely joined using fastening means 70 such as bolts. As will be described below in connection with FIG. 4, chip-site cutouts are then formed into the mother substrate 22a.

The packaging apparatus 10a electrically connects to a computer backplane (not shown) via a flex connector cable 74a coupled to an I/O pad 72a of mother substrate 22a. The fastening means 70 also provides mechanical support for the apparatus 10 when inserted into the backplane.

In accordance with the built-in heat removal feature of the present invention, the chips 40, when placed in the chip-site cutouts 25, affixed to the either the surface 36a of cold plate 35a or the base metal layer of member 22a by a thermal compound and operating under power, dissipate heat energy which is conducted to the cold plate 35a and transferred from the packaging apparatus 10 by a cooling fluid.

The front view of the packaging apparatus 10a in FIG. 2 also illustrates the expansion potential of the modular assembly arrangement. A plurality of chip-populated daughter substrates 12d-f are mounted to surface 24b of a mother substrate 22b using the bonded pin process. A surface 26b of the mother substrate 22b and surface 34a of cold plate 35a are then affixed in intimate thermal conductive relation as described above. It is to be understood that this modular assembly feature could continue to all surfaces of cold plate, thereby providing further interconnection of chips in a compact, high-density packaging arrangement, while maintaining inherent heat removal capabilities.

Figure 3:
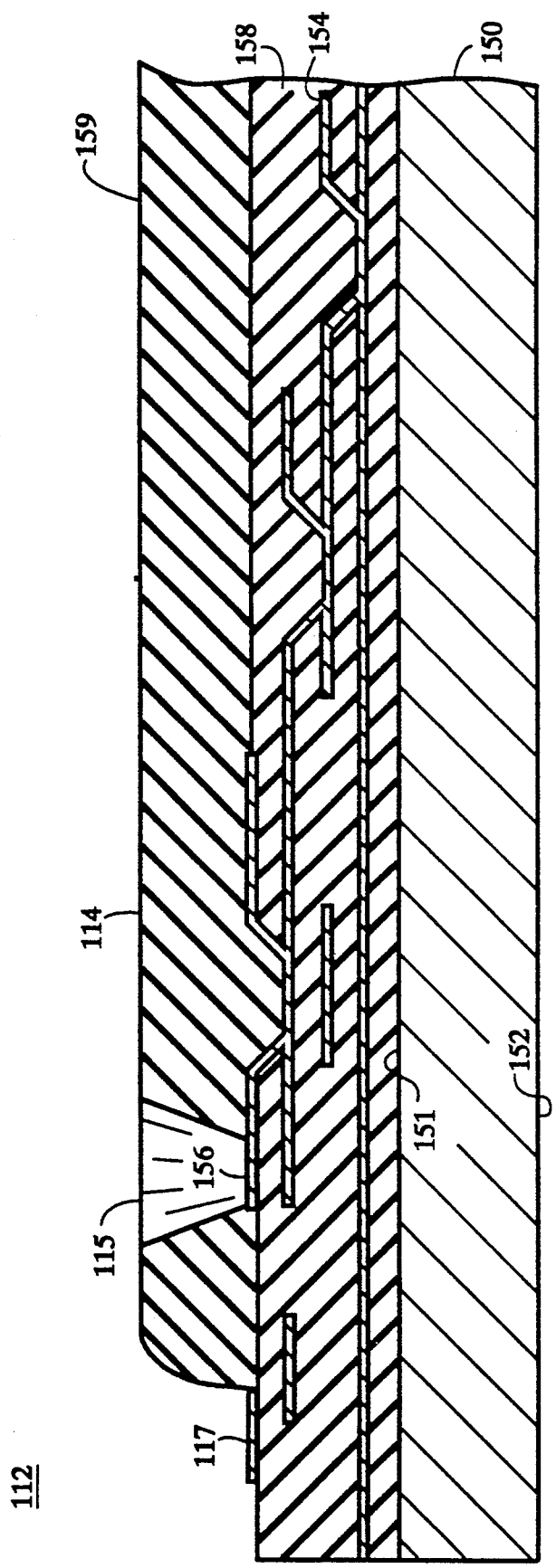
FIG. 3 is a cross-section view of an embodiment of a generic multilayer substrate adapted for use in the high-density packaging apparatus of FIG. 1.

With reference now to FIG. 3, a cross-section view of a generic embodiment of a multilayer substrate 112 is depicted. Although a mother substrate is generally larger in length and width than a daughter substrate, the internal structure of both substrates is generally identical and, as a result, the following discussion relates equally to the construction of both multilayer substrates.

The multilayer substrate 112 is a generally planar member having a plurality of conductive layers and non-conductive or insulative layers deposited upon a base substrate layer. The base layer 150 has a top side 151 and a bottom side 152. Base layer 150 may be composed of any suitable substrate material such as ceramic, silicon or metal. Silicon is the preferred material for the base layer of the daughter substrate 12 (see FIG. 1) because of its good thermal conductivity and its light weight, which facilitates mounting on the mother substrate 22. However, metal is the preferred material for the base layer of the mother substrate 22 because it provides thermal conductivity and thermal matching with the cold plate 35.

Disposed upon the top side 151 of the base silicon layer 150 are a plurality of layers of conductor 154 separated by a plurality of layers of insulator 158. The conductor layers 154 function as both signal and power/ground conductors and are preferably made of copper due to its low resistivity. Although silicon dioxide may be employed as the insulating layers 158, polyimide is the preferred material since it has a low dielectric constant and is able to planarize the structure of the underlying conductor patterns when applied by spinning or spraying, thereby allowing for the fabrication of multilayer metallic structures without a step coverage problem. A top, relatively thick layer 159 of insulative material, e.g. polyimide, is disposed upon the member 112 to provide a basis for a solder well aperture 115 described below.

The perimeter of surface 114 of substrate 112 is depicted as recessed to expose a conductor pad 117. For the construction of the mother substrate 22, the conductor pad 117 functions as an I/O pad and enables electrical coupling to other mother substrates 22 or to a computer backplane via a flex cable 74a,b (see FIG. 2). For the daughter substrate 12, conductor pad 117 preferably resides in and terminates a solder well aperture, similar to solder well aperture 115. In this latter case, the conductor pad 117 provides a means for bonding the daughter substrate 12 to a mother substrate 22, as described further in connection with FIG. 4.

The multilayer substrate 112 is designed to accommodate the pitch between the bonding pads 44 of the chip 40 when bonded thereto. That is to say, the substrate 112 is a multilayer structure initially fabricated using thin-film techniques to produce a plurality of internal signal and power conductor layers which facilitate high-performance interconnections between devices connected to the substrate. The number of internal layers in the multilayer thin-film structure of substrate members 12 and 22 may vary depending upon the specific application.

A solder well 115 is thereafter formed in the surface 114 of the multilayer substrate 112 in accordance with the particular pitch of a chip 40. A conductor layer 154 having an electrically conductive pad 156 terminates the solder well 115 and provides interconnection between the chips 40.

A feature of the present invention involves the fast and efficient repairability of the chips 40 bonded to the multilayer substrate 112 or, more precisely, the ability to cost effectively replace certain chips assembled to the substrate member 112 prior to encapsulation. Since the entire substrate is typically heated when removing just one chip, it is necessary to provide a means for stabilizing the other chips mounted to the substrate. The structure of the substrate 112, in conjunction with the use of solder well 115 provide such a stabilizing means. The member 112 is built upon only one side of the base layer 150. As a result, the entire substrate 112 can be heated with pins from the chips 40 resting in similar solder wells 115 located on the surface 114.

Figure 4:
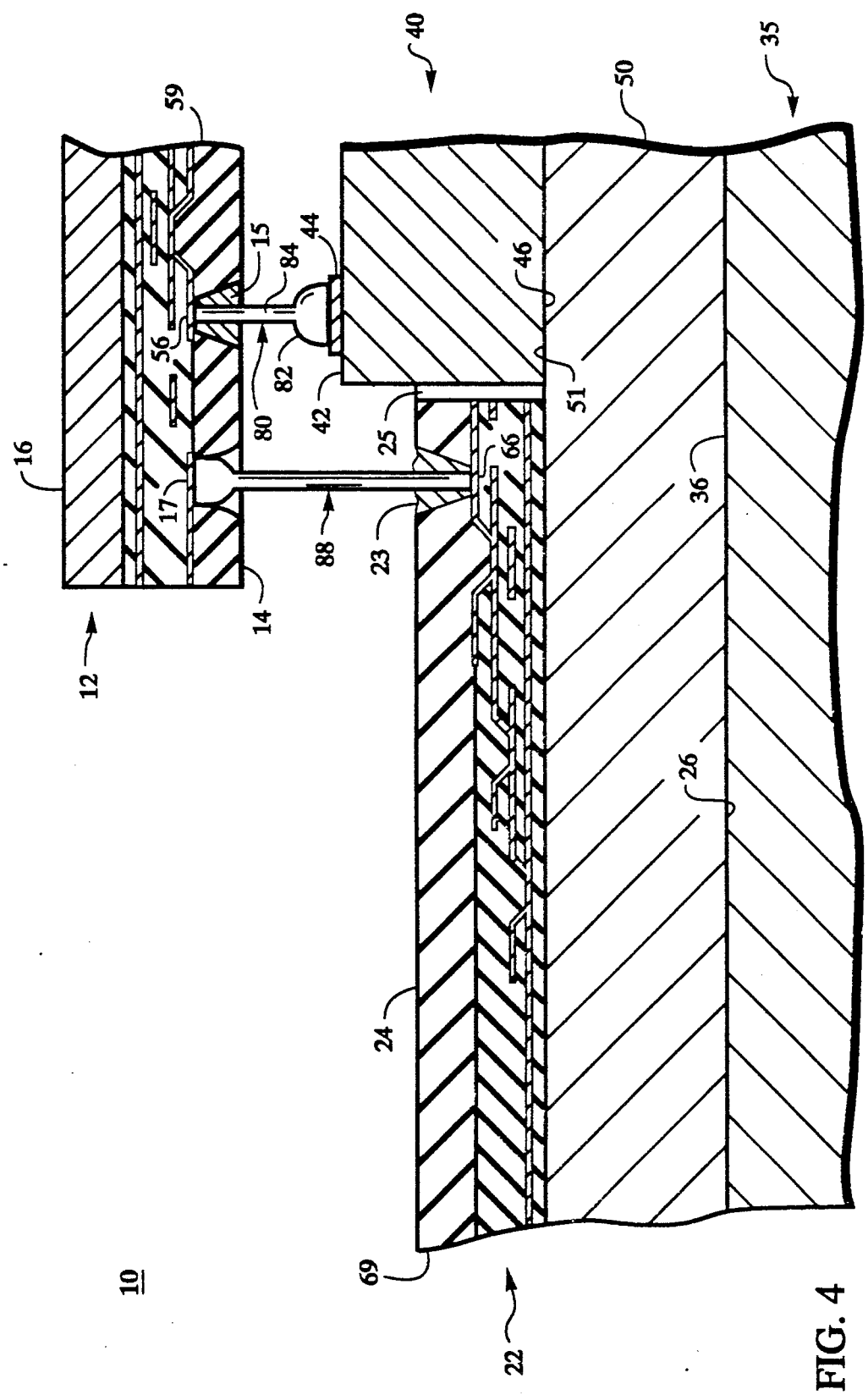
FIG. 4 is cross-section view of an assembled multilayer substrate and semiconductor chip arrangement of FIG. 1.

FIG. 4 is cross-section view of a portion of the high-density packaging apparatus 10 showing the interconnection between multilayer substrates 12 and 22 and chip 40. After construction of the daughter substrate 12, an aperture in the form of a solder well 15 is formed in the surface 14. The solder well 15 is formed by etching the top, thick layer 59 of polyimide until the well 15 is terminated by an electrically conductive pad 56 within the daughter substrate 12. In other words, the solder well 15 is formed to expose the conductive pad 56 within the substrate 12. The solder well 15 provides a means for receiving an internal bonded pin 80 that is affixed to the conductor pad 56 when mounting chip 40 to the daughter substrate 12.

Also located on surface 14 of the daughter substrate 12 is an electrically conductive bonding pad 17. The bonding pad 17 is actually an extension to a conductor layer, similar to conductive pad 56, in the multilayer substrate 12 which is not covered by the top layer 59. The bonding pad 17 provides a source for an external bonded pin 88 used for bonding the daughter substrate 12 to the mother substrate 22.

An aperture in the form of solder well 23 is also formed in the surface 24 of the mother substrate 22. The solder well 23 is formed in a manner similar to that described above for solder well 15 and is likewise terminated by conductive pad 66 within the multilayer substrate 22. In this case, however, the solder well 23 provides a means for receiving the external bonded pin 88 that is affixed to the conductor pad 66 when mounting the daughter substrate 12 to the mother substrate 22.

Also located on surface 24 of the mother substrate 22 is a larger aperture in the form of a chip-site cutout 25. The cutout 25 is formed by cutting through the mother substrate 22, such as with a laser. In an embodiment of the present invention, the chip-site cutout 25 is formed either before or after affixing the substrate 22 to the cold plate 35. In this case, the cutout 25 extends to the internal metal base layer 50 of the mother substrate 22 so that the top side 51 of base layer 50 terminates the cutout 25. In an alternate embodiment, the metallized base layer 50 is stripped from the mother substrate 22 and the remaining layers of the mother substrate 22 are laminated directly onto the surface 36 of cold plate 35. The chip-site cutout 25 is then formed completely through the member 22, such that the surface 36 of cold plate 35 terminates the cutout 25. The size of cutout 25 is preferably slightly larger than the size of chip 40, that is, the length and width of the cutout 25 is slightly larger than the length and width of a chip 40 so that the chip 40 can fit snugly therein.

As mentioned, chip 40 has a generally planar surface 42 with at least one bonding pad 44 formed thereon. The bonding pad 44 provides a source for an internal bonded pin 80 used for bonding chip 40 to the daughter substrate 12. The other generally planar surface 46 of chip 40 is affixed to either the top side 51 of the base layer 50 of substrate 22 or to the surface 36 of cold plate 35 in intimate thermal conductive relation using a thermal compound.

An example of a method and apparatus used to form a bonded pin is described in an article entitled, "Bonded Interconnect Pin (BIP ™) Technology, A Novel Bare Chip Assembly Technique For Multichip Modules" by Baba et al. in "Proceedings of the 1990 International Electronics Packaging Conference", Sep., 1990 at pages 1080–1091. A bonded pin 80 is formed by feeding a gold wire through a small capillary tube and forming a ball 82 at the exposed end. The ball 82 of wire is then bonded to bonding pad 44 of chip 40 by thermocompression or thermosonic stimulation, similar to conventional wire bonding, thus creating a compressed metal-to-metal joint. The top wire portion 84 of the pin 80 is subsequently lifted through the capillary tube and clipped by discharging an arc from a small electrode. After all the bonded pins 80 are formed on the bonding pads 44 of chip 40, they are planarized using a shear plate.

The chip 40 is then "flipped" over and the top portion 84 of bonded pin 80 is inserted into a corresponding solder well 15 of daughter substrate 12 until the top 84 contacts conductive pads 56 within substrate 12. In order to ensure reliable interconnection, all the chip's bonded pins 80 should establish contact with the conductive portions 56 of their respective solder wells 15. It is for this reason the planarity feature of the bonded pin process is advantageous. Thereafter, molten solder is placed into solder well 15 and when hardened, a bonded pin connection is established. The method is subsequently repeated to bond the multilayer substrate 12 to substrate 22.

The bonded pin 80, in conjunction with the solder well 15 provide certain advantages to the use of other bare chip assembly techniques. A small pin connects the chip 40 to the daughter substrate 12, thus avoiding the use of a solder joint which may be fractured due to thermal mismatch. The bonded pin 80 results in a relatively short lead length connection between the chip 40 and substrate 12, which lowers inductance and capacitance effects. The pin 80 is also compliant and allows a certain degree of flexibility for alignment and registration during bonding. Finally, the pin-in-hole configuration provides a fast and effective means of repair because global heating can be performed to the entire daughter substrate 12. The solder wells 15 restrain the flow of solder and the movement of the chips 40 during heating of the substrate, so that a vacuum pencil can be used to remove a defective chip 40 without the risk of interfering with other, closely mounted chips 40.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A high-density packaging apparatus for bare semiconductor chips having a plurality of bonding pads, said apparatus comprising:
   first substrate means for interconnecting said bare chips, said first substrate means having a plurality of solder wells terminated by conductor pads and a plurality of bonding pads;
   second substrate means for effecting connection with said first substrate means, said second substrate means having a plurality of solder wells terminated by conductor pads and a plurality of apertures terminated by a metallized base layer of said second substrate means for receiving said chips;
   pin means for connecting said chips to said first substrate means and for connecting said first substrate means to said second substrate means, said pin means comprising:
   a first set of pins bonded to said bonding pads of said chips and affixed to said conductor pads within said solder wells of said first substrate means to provide a first level of interconnection for said chips; and
   a second set of pins bonded to said bonding pads of said first substrate means and affixed to said conductor pads within said solder wells of said second substrate means to provide a second level of chip interconnection when other first substrate means are connected to said second substrate means, said chips being disposed in said apertures and substantially in thermal conductive relation with said metallized base layer.

2. The high-density packaging apparatus of claim 1 wherein said pin means includes a gold wire having a ball formed on an end thereof.

3. The high-density packaging apparatus of claim 2 wherein said pin means are bonded by bonding said ball of wire to said bonding pads.

4. The high-density packaging apparatus of claim 3 wherein said bonding comprises thermosonic stimulation.

5. The high-density packaging apparatus of claim 1 further comprising cold plate means substantially affixed in thermal conductive relation to said metallized layer of said second substrate means for conducting heat generated by said chips.

6. The high-density packaging apparatus of claim 5 wherein said cold plate means has an internal channel structure adapted for receiving a cooling fluid to provide a heat-removing mechanism for heat generated by said bare semiconductor chips.

7. An apparatus for densely-packaged bare semiconductor chips having a first surface and a second surface, said first surface including a plurality of bonding pads, said apparatus comprising:
   first multilayer substrate means for interconnecting said bare semiconductor chips, said first multilayer substrate means having a plurality of solder wells terminated by conductor pads and a plurality of bonding pads located on a first surface thereof;
   second multilayer substrate means for interconnecting a plurality of said first multilayer substrate means, said second multilayer substrate means having a first and a second surface, said first surface having a plurality of solder wells terminated by conductor pads and having a plurality of apertures located thereon, said apertures dimensioned to receive said bare semiconductor chips;
   bonded pin means for connecting said bonding pads of said bare semiconductor chips to said conductor pads of said solder wells of said first multilayer substrate means and for connecting said bonding pads of said first multilayer substrate means to said conductor pads of said solder wells of said second multilayer substrate means, said chips being disposed in said apertures; and
   cold plate means affixed in thermal conductive relation to said second surface of said second multilayer substrate means for terminating said apertures, said cold plate means being in intimate thermal conductive relation to said second surface of said semiconductor chips disposed in said apertures, said cold plate means having an internal channel structure adapted for receiving a cooling fluid to provide an inherent heat-removing mechanism for heat energy generated by said bare semiconductor chips used in said packaging apparatus.

8. The apparatus of claim 7 wherein said bonded pin means comprises a gold wire having a ball formed on an end thereof and wherein said bonding pads provide a source for bonding said ball of wire.

9. An assembly for packaging bare chips each of which has a first surface including a plurality of bonding pads, said assembly comprising:
 a first generally planar substrate member having a plurality of solder wells terminated by conductor pads and having bonding pads located on a first surface thereof;
 a second generally planar substrate member having a first and second surface, said first surface having a plurality of solder wells terminated by conductor pads and having a plurality of apertures terminated by a metallized base layer of said second substrate member for receiving said bare chips;
 a first set of bonded pins each including a gold wire having a ball formed on an end thereof, wherein said ball is thermosonically bonded to the bonding pad of said bare chip and wherein said wire portion of said pin is inserted into a corresponding solder well of said first substrate member and soldered to said conductor pad thereof;
 a second set of bonded pins each including a gold wire having a ball formed on an end thereof, wherein said ball is thermosonically bonded to said bonding pad of said first substrate member and wherein said wire portion of said pin is inserted into a corresponding solder well of said second substrate member and soldered to said conductor pad thereof to effect connection with said first substrate member, said chips being disposed in said apertures and in thermal conductive relation to said metallized base layer of said second substrate member; and
 a cold plate affixed in thermal conductive relation to said second surface of said second substrate member for conducting heat energy generated by said bare chips disposed in said apertures, said cold plate having an internal channel structure adapted for receiving a cooling fluid to provide an inherent heat-removing mechanism for said bare chips used in said packaging apparatus.

* * * * *